(12) United States Patent
Leobandung

(10) Patent No.: US 10,741,611 B1
(45) Date of Patent: Aug. 11, 2020

(54) RESISTIVE PROCESSING UNITS WITH COMPLEMENTARY METAL-OXIDE-SEMICONDUCTOR NON-VOLATILE ANALOG MEMORY

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/272,158

(22) Filed: Feb. 11, 2019

(51) Int. Cl.
  G11C 11/00 (2006.01)
  H01L 27/24 (2006.01)
  G11C 13/00 (2006.01)
  H01L 27/11521 (2017.01)
  G06N 3/08 (2006.01)
  G11C 5/06 (2006.01)

(52) U.S. Cl.
  CPC ......... *H01L 27/2463* (2013.01); *G06N 3/082* (2013.01); *G06N 3/084* (2013.01); *G11C 5/063* (2013.01); *G11C 13/004* (2013.01); *H01L 27/11521* (2013.01); *G11C 2013/0045* (2013.01)

(58) Field of Classification Search
  CPC .......... G11C 13/004; G11C 2013/0042; G11C 13/0038; G11C 2013/0045; G11C 2013/0054; G11C 2213/77; G11C 11/54; G11C 27/00; G11C 11/56; G11C 13/0002; G11C 13/003; G11C 2013/005
  See application file for complete search history.

(56) References Cited

U.S. PATENT DOCUMENTS

| 8,705,280 | B2 | 4/2014 | Cai et al. |
| 10,319,439 | B1* | 6/2019 | Li ......................... G11C 13/004 |
| 2008/0044973 | A1 | 2/2008 | Kalnitsky et al. |
| 2016/0204002 | A1 | 7/2016 | Wallace et al. |
| 2017/0364790 | A1 | 12/2017 | Leobandung |

FOREIGN PATENT DOCUMENTS

WO 2013/122781 A1 8/2013

* cited by examiner

*Primary Examiner* — Thong Q Le
(74) *Attorney, Agent, or Firm* — Vazken Alexanian; Ryan, Mason & Lewis, LLP

(57) ABSTRACT

A cross-bar array includes one or more input row lines, one or more output column lines, one or more resistive processing units (RPUs) coupled at one or more intersections of the input row lines and the output column lines, and a control circuit. A given one of the RPUs includes an analog memory element including a first terminal coupled to a given one of the input row lines and a second terminal coupled to a given one of the output column lines. The analog memory element includes a complementary metal-oxide-semiconductor structure including an n-type field-effect transistor and a p-type field-effect transistor. A gate of the n-type field-effect transistor is coupled to a gate of the p-type field effect transistor to provide a floating gate. The control circuit is configured to read a synaptic weight value of the given RPU by measuring a stored electrical charge of the floating gate.

20 Claims, 8 Drawing Sheets

RESISTIVE PROCESSING UNITS WITH COMPLEMENTARY METAL-OXIDE-SEMICONDUCTOR NON-VOLATILE ANALOG MEMORY

BACKGROUND

The present application relates to semiconductors, and more specifically, to techniques for forming cross-bar arrays. Arrays of trainable resistive crosspoint devices may be used to provide a cross-bar array. The trainable resistive crosspoint devices, or resistive processing units, may be used in a wide variety of application areas, including performing machine learning computations in an analog domain.

SUMMARY

Embodiments of the invention provide techniques for providing resistive processing units that comprise complementary metal-oxide-semiconductor non-volatile analog memory elements.

In one embodiment, a cross-bar array comprises one or more input row lines, one or more output column lines, one or more resistive processing units coupled at one or more intersections of the one or more input row lines and the one or more output column lines, and a control circuit. A given one of the one or more resistive processing units comprises an analog memory element comprising a first terminal coupled to a given one of the input row lines and a second terminal coupled to a given one of the output column lines. The analog memory element comprises a complementary metal-oxide-semiconductor structure comprising an n-type field-effect transistor and a p-type field-effect transistor. A gate of the n-type field-effect transistor is coupled to a gate of the p-type field effect transistor to provide a floating gate. The control circuit is configured to read a synaptic weight value of the given resistive processing unit by measuring a stored electrical charge of the floating gate.

In another embodiment, a resistive processing unit comprises an analog memory element comprising a first terminal coupled to an input row line of a cross-bar array and a second terminal coupled to an output column line of the cross-bar array. The analog memory element comprises a complementary metal-oxide-semiconductor structure comprising an n-type field-effect transistor and a p-type field-effect transistor. A gate of the n-type field-effect transistor is coupled to a gate of the p-type field effect transistor to provide a floating gate. A stored electrical charge of the floating gate provides a synaptic weight value of the resistive processing unit.

In another embodiment, a method for reading a synaptic weight value of a given resistive processing unit comprises applying a first voltage to a given one of one or more input row lines of a cross-bar array, applying a second voltage to a given one of one or more output column lines of the cross-bar array, and measuring a current across the given resistive processing unit having a first terminal coupled to the given input row line and a second terminal coupled to the given output row line. The given resistive processing unit comprises an analog memory element comprising a complementary metal-oxide-semiconductor structure comprising an n-type field-effect transistor and a p-type field-effect transistor, a gate of the n-type field-effect transistor being coupled to a gate of the p-type field effect transistor to provide a floating gate, and the measured current being a function of a stored electrical charge of the floating gate providing the synaptic weight value of the given resistive processing unit.

DETAILED DESCRIPTION

Figure 1:
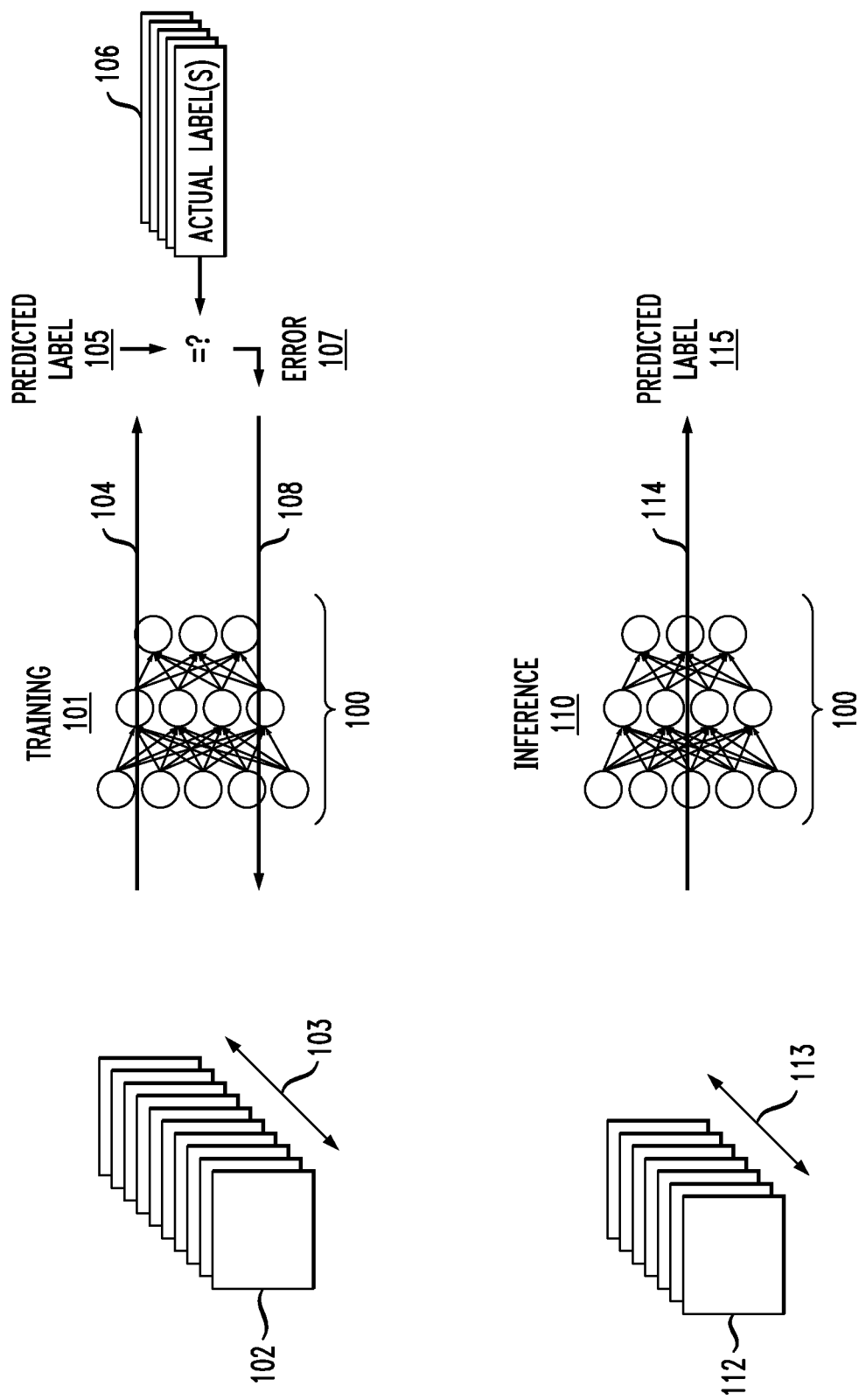
FIG. 1 depicts training and inference for machine learning using a neural network, according to an embodiment of the present invention.

Illustrative embodiments of the invention may be described herein in the context of illustrative resistive processing units that comprise complementary metal-oxide-semiconductor non-volatile analog memory elements. However, it is to be understood that embodiments of the invention are not limited to the illustrative methods, apparatus, systems and devices but instead are more broadly applicable to other suitable methods, apparatus, systems and devices.

Neural networks may be used to implement machine learning and inference for cognitive computing. While neural networks can be implemented at a software level, neural networks implemented in hardware are more efficient. For example, a neural network may be implemented in hardware through a cross-bar implementation with the crosspoint devices having variable resistance used to represent weight values. Such crosspoint devices are also referred to herein as resistive processing units (RPUs).

Machine learning is a term used herein to broadly describe a function of electronic systems that learn from data. In machine learning and cognitive science, artificial neural networks (ANNs) are a family of statistical learning models. ANNs are inspired by biological neural networks of animals (e.g., the brain). ANNs may be used to estimate or approximate various systems and functions that depend on a large number of inputs, particularly where inputs are generally unknown.

ANNs may be embodied as "neuromorphic" systems of interconnected processor elements that act as simulated neurons and exchange messages between each other in the form of electronic signals. Similar to the so-called plasticity of synaptic neurotransmitter connections that carry messages between biological neurons, connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition may be defined by a set of input neurons, which may be activated by pixels of an input image. After being weighted and transformed by a function determined by a designer of the ANN, the activations of the input neurons are passed to other downstream neurons, often referred to as hidden neurons. This process is repeated until an output neuron is activated, with the activated output neuron determining which character was read.

Crossbar arrays, also referred to as crosspoint arrays or crosswire arrays, are high density and low cost circuit architectures used to form a variety of electronic circuits and devices, including but not limited to ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices.

Crosspoint devices, in effect, function as an ANN's weighted connections between neurons. Each crosspoint device is a two-terminal device that emulates synaptic plasticity. The conduction state (e.g., resistance) of the crosspoint devices may be altered by controlling voltages applied between individual wires of the row and column wires. Digital data may be stored by alteration of the conduction state at the crosspoint devices in the crossbar array.

A neural network may use back propagation for learning, which involves a forward pass, a backward pass and a weight update. In the forward pass, the input of each layer is multiplied with a weight matrix and fed to an activation function. The output becomes the input of the next layer until the last layer is reached. The error, with respect to an ideal output, is then calculated through a loss function. In the backward pass, the network error of the last layer is propagated back to calculate the error of each previous layer. This may be done recursively by computing a local gradient for each neuron. The local gradients are then used to perform each weight update.

Various types of devices may be used as crosspoint devices. For inference purposes, an electrically erasable programmable read-only memory (EEPROM) can be used as a variable resistance. EEPROM fabrication, however, is more complex than complementary metal-oxide-semiconductor (CMOS) fabrication. In some embodiments, CMOS technology is used to provide floating gate variable resistance weight for crosspoint devices in a crossbar array implementing an ANN.

FIG. 1 illustrates training 101 and inference 110 for machine learning using a neural network 100. During training 101, known input data 102 is provided to the neural network 100. The known input data 102, for example, may include a set of N images 103 to be classified or labeled for training the neural network (e.g., by calculating any error 107 in the classification and propagating that error back to the neural network 100 as described below). During inference 110, unknown input data 112 is provided to the neural network 100 for classification. The unknown input data may include a set of N images 113 to be classified or labeled. The value of "N" may be comparatively larger in training 101 than during inference 110, though the unknown input data 112 used during inference 110 may be more varied.

Training 101 includes a forward pass 104, where the known input data 102 is passed through the neural network 100 and a predicted label 105 is provided. The known input data 102 used during training 101 includes, for example, images with known or actual labels 106. The predicted label 105 may be compared with the actual labels 106 so as to determine an error 107 that is propagated to the neural network 100 during a backward pass 108. The error 107 may be used to update the weights of the various connections in the neural network 100 (e.g., resistance values for crosspoint devices in a crosspoint array). After training 101, unknown input data 112 is provided to the trained neural network 100 and in a forward pass 114 a predicted label 115 is output.

Figure 2:
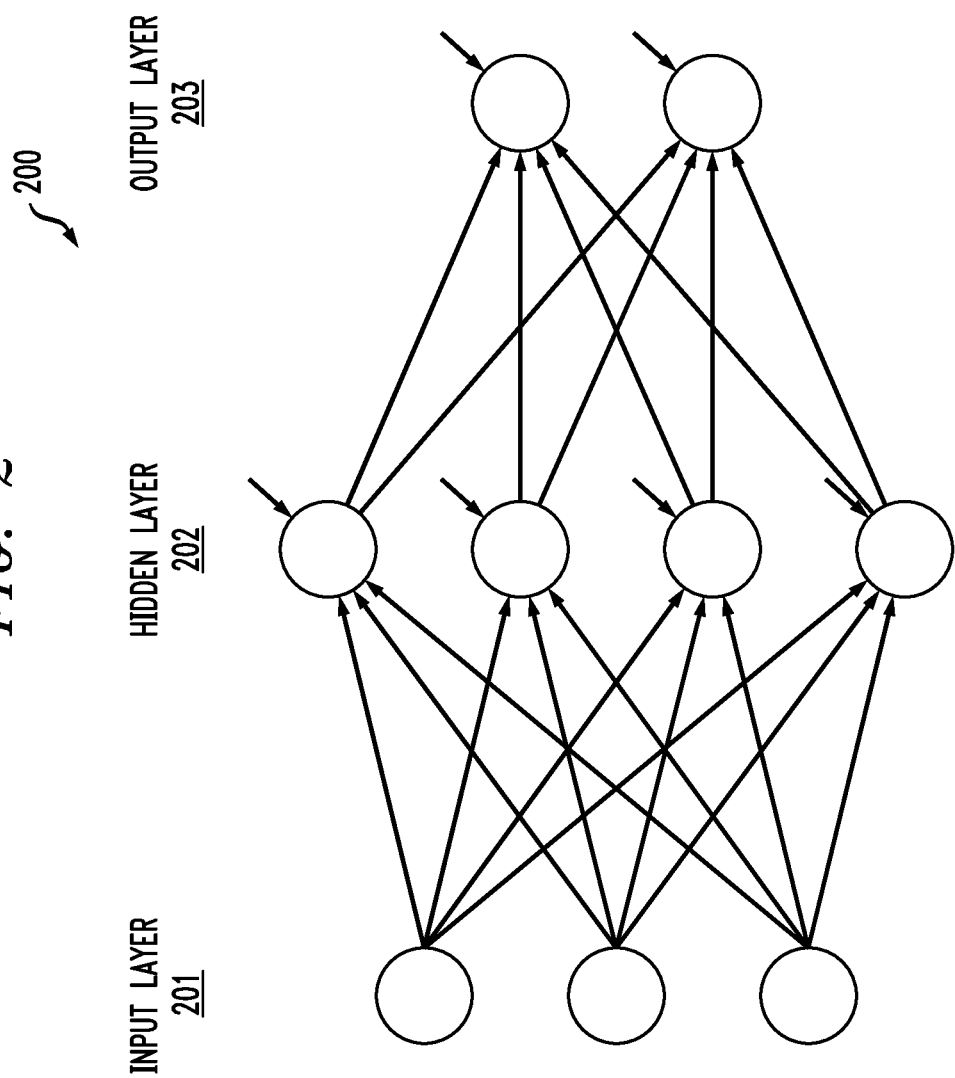
FIG. 2 depicts a feed-forward neural network, according to an embodiment of the present invention.

FIG. 2 illustrates an example of computing output values in a feed-forward neural network 200 including an input layer 201, a hidden layer 202 and an output layer 203. The input layer 201 includes three nodes, the hidden layer 202 includes four nodes, and the output layer 203 includes two nodes. The neural network 200 is an example of a fully connected neural network. Each arrow connecting one node to another represents a weight value. Each node in the hidden layer 202 and output layer 203 also includes a bias, represented as an arrow entering the upper right of each node.

In the feed-forward neural network 200, the process begins by computing the values for the nodes in the hidden layer 202. Each hidden node value is determined by applying an activation function to a sum of the products of the values of the nodes in the input layer 201 and their associated weight values, plus that node's bias value. For example, assume the values of the input nodes in the input layer 201 are 1, 2 and 3, respectively, and that the weights of the connections between the nodes in the input layer 201 and the first node of the hidden layer 202 (e.g., a top-most node in the hidden layer 202) are 0.01, 0.02 and 0.03, respectively. Further assume that the bias value for the first node of the hidden layer 202 is 0.10. Thus, the value of the first node of the hidden layer 202 is: (1.0)(0.01)+(2.0)(0.02)+(3.0)(0.03)+0.10=0.24, which is then applied to its activation function. The activation function, for example, may be the hyperbolic tangent function, a logistic sigmoid function, etc. The values of the output nodes in the output layer 203 are determined in a similar fashion. In some cases, preliminary output values are first calculated for the two nodes of the output layer 203, with the preliminary values then being combined using an activation function such as a softmax function to give final output values that sum to 1 (e.g., such that the output values can be interpreted as probabilities). In the neural network 200, there are two output nodes, and suppose they correspond to predicted labels for input data (e.g., input image data 102/112 in FIG. 1). The predicted labels may be "dog" or "cat." Dog may be coded as (1,0), with cat being coded as (0,1). If the output values in the output layer 203 are (0.47, 0.53), the higher probability is the second position and the predicted label for the input image will be "cat." Binary neural network classification (e.g., where there are two output values) does not require the use of the softmax activation function. Instead, a logistic sigmoid function may be used with a single output and 0 to 1 encoding (e.g., with 0 representing an image of a dog and 1 representing an image of a cat in the above example).

Figure 3:
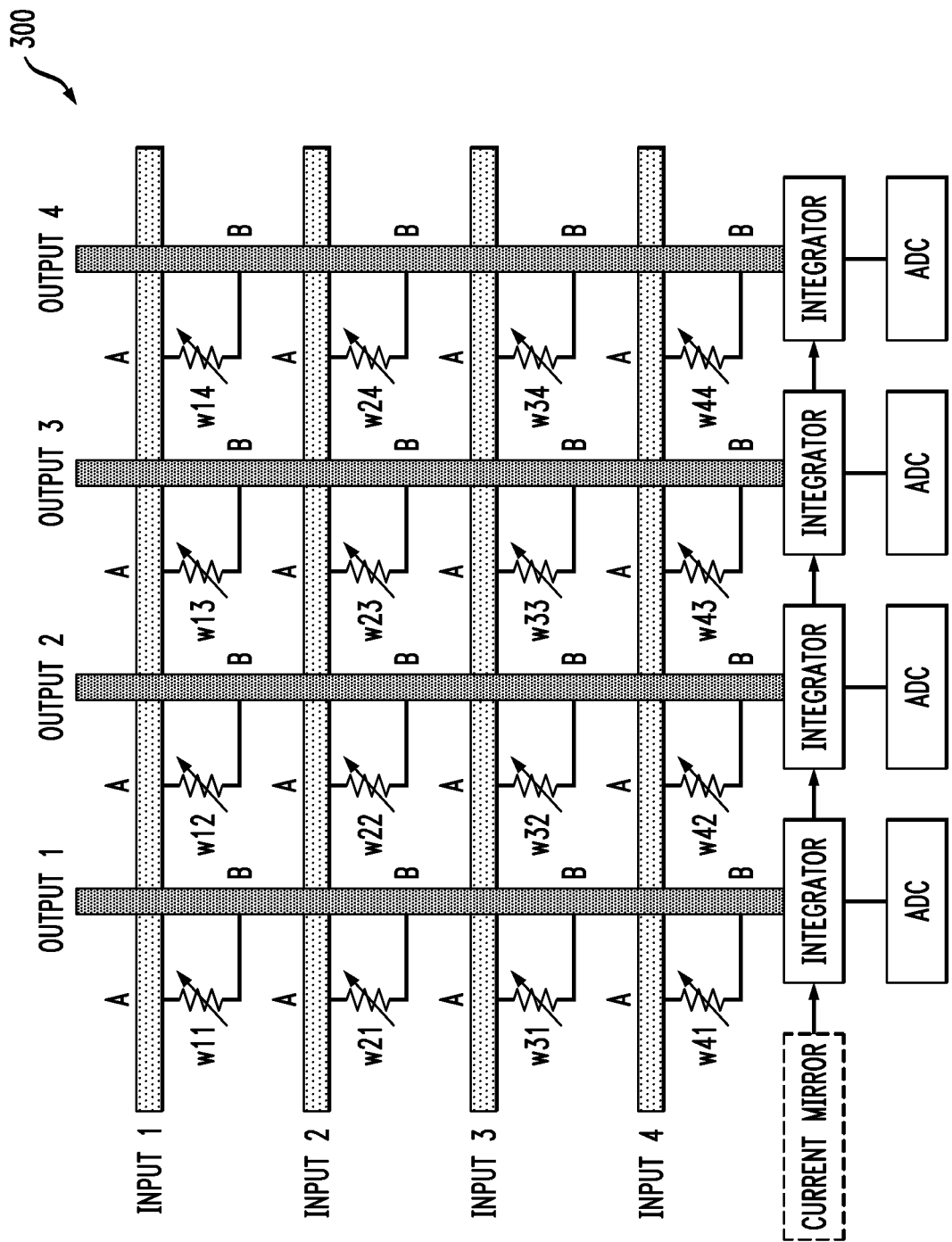
FIG. 3 depicts a crossbar array with resistive processing units at the intersection of input and output lines, according to an embodiment of the present invention.

FIG. 3 depicts a crossbar array 300 that may be used to provide a hardware implementation of an ANN. In the FIG. 3 example, there are four input lines and four output lines. It should be appreciated, however, that the numbers of input and output lines may vary as desired (e.g., the numbers of rows and columns in the crossbar array may be greater than or less than 4). Further, there need not necessarily be the same number of input and output lines.

At each "crosspoint" of the crossbar array 300, a variable weight unit cell or resistive processing unit (RPU) is coupled between nodes A and B. The resistance of the RPUs may be varied to represent weight values. For example, the RPUs of input line 1 have weight values w11, w12, w13, and w14, the RPUs of input line 2 have weight values w21, w22, w23 and w24, etc. These weights are read out by measuring current using the current integrators and analog-to-digital converters (ADCs) of the output lines. The current integrator reads out the current for a particular RPU, and the ADC converts the current (e.g., an analog value) to a numerical value (e.g., a digital value). The current integrators and ADCs may be viewed as collectively providing a "control circuit" that reads the synaptic weight values of the RPUs in the crossbar array 300.

In operation, a fixed voltage is applied at one of the input lines, while a zero voltage is applied for the other input lines. In the description below, it is assumed that a fixed voltage is applied to input line 1 (e.g., the first row), and all other input lines are held at zero voltage. Currents for the RPUs in the first row are read out through the integrators in the four output lines, e.g., the current for the RPU with weight w11 is read out from the integrator for output line 1, the current for the RPU with weight w12 is read out from the integrator for output line 2, the current for the RPU with weight w13 is read out from the integrator for output line 3, and the current for the RPU with weight w14 is read out from the integrator for output line 4. In some embodiments, a reference current may be provided to the integrators (e.g., using a current mirror) to determine "positive" and "negative" weight values. For example, current above the reference current may be considered "positive" weight, while current below the reference current is considered "negative" weight.

Figure 4:
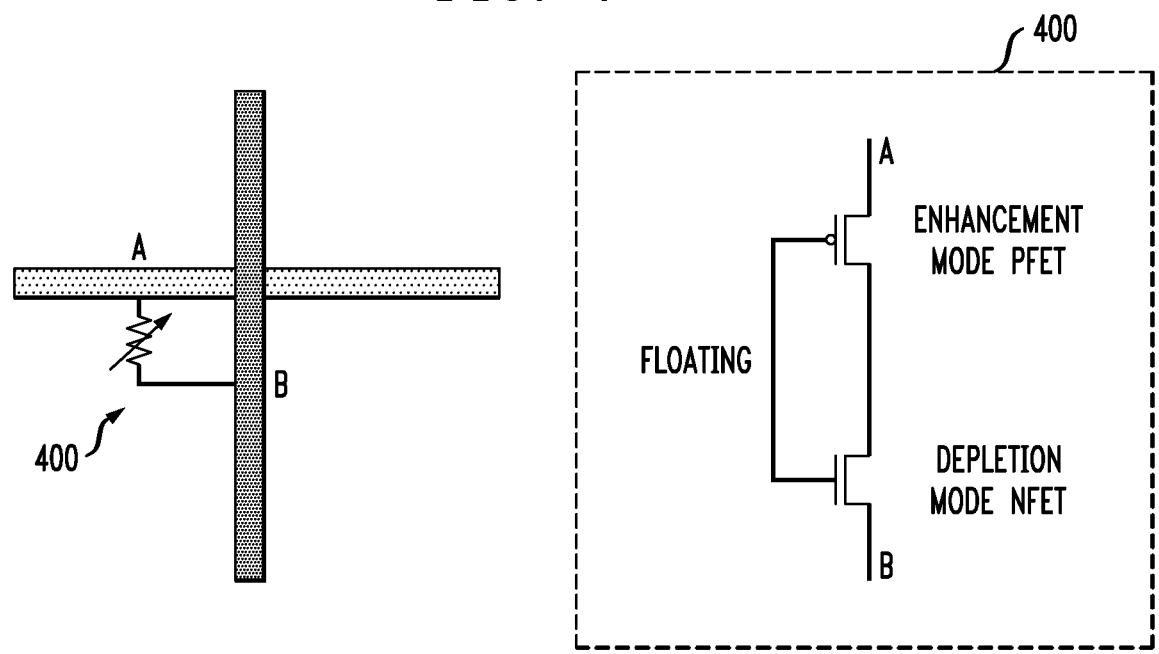
FIG. 4 depicts a resistive processing unit including an analog memory element formed from two complementary metal-oxide-semiconductor transistors with a floating gate, according to an embodiment of the present invention.

FIG. 4 depicts a CMOS-based RPU 400 that may be used to implement the RPUs in the crossbar array 300 of FIG. 3. As illustrated, the CMOS-based RPU 400 includes an analog memory element connected between A and B. The analog memory element is formed from two CMOS transistors with a floating gate—an enhancement mode p-type FET (PFET) and a depletion mode n-type FET (NFET). It should be appreciated, however, that this may be reversed (e.g., the enhancement mode transistor may be an NFET and the depletion mode transistor may be a PFET), though corresponding changes to the logic and programming of weight values would be required. The enhancement mode PFET and depletion mode NFET are in a series connection, with a first source/drain node of the depletion mode NFET connected to a first source/drain node of the enhancement mode PFET. The gate electrodes of the enhancement mode PFET and depletion mode NFET are connected to one another and are electrically floating, thereby providing a common floating gate. The common floating gate is electrically floating, in that it is configured to retain electrical charges therein with little or no leakage current. Together, the enhancement mode PFET and depletion mode NFET provide a floating-gate CMOS device used as the RPU 400.

The retained electrical charge in the floating gate of the RPU 400 corresponds to the resistance or weight value. The weight value of the RPU 400 may be measured be reading out the current for the RPU 400 as described above with respect to FIG. 3. If the weight does not match a desired value, the resistance may be changed by injecting or subtracting electrons from the floating gate (e.g., altering the retained electrical charge of the floating gate). Returning to FIG. 3, assume that the measured current for w11 is too high relative to a desired weight value for that RPU. In this case, electrons may be injected to the floating gate by applying a negative pulse (e.g., Vdd in the range of −3 volts (V) to −5V) to input line 1 while holding output line 1 at ground (e.g., 0V). The other input and output lines may be held at half the negative pulse (e.g., half minus Vdd). If the measured current for w11 is too low relative to a desired weight value for that RPU, electrons may be subtracted from the floating gate. This may be achieved by applying a positive pulse (e.g., Vdd in the range of 3V to 5V) to input line 1 while holding output line 1 at ground (e.g., 0V). The other input and output lines may be held at half the positive pulse (e.g., half positive Vdd). These steps may be repeated until the desired current is measured for the w11 RPU. Similar processing may be used to update other weight values, with the particular input line being pulsed varying accordingly.

Additional details regarding the use of such a floating-gate CMOS device as a RPU 400 for the variable weight unit cells in a crossbar array for a hardware implementation of an ANN will now be described in further detail with respect to FIGS. 5-8. Although FIGS. 5-8 illustratively show the floating-gate CMOS device formed using planar FETs, it should be appreciated that the enhancement mode PFET and depletion mode NFET may be formed using various CMOS fabrication techniques, including but not limited to bulk CMOS fabrication processes, semiconductor-on-insulator (SOI) CMOS fabrication processes, fin-type FET (finFET) CMOS fabrication processes, vertical transport FET (VT-FET) CMOS fabrication processes, etc.

Figure 5A:
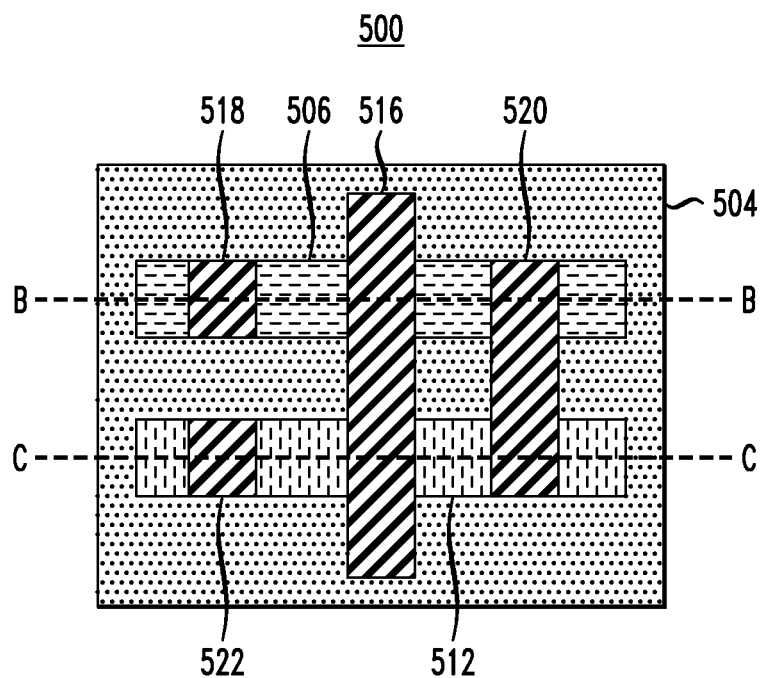
FIG. 5A depicts a top-down view of a resistive processing unit comprising an analog memory element formed from two planar complementary metal-oxide-semiconductor transistors with a floating gate, according to an embodiment of the present invention.
Figure 5B:
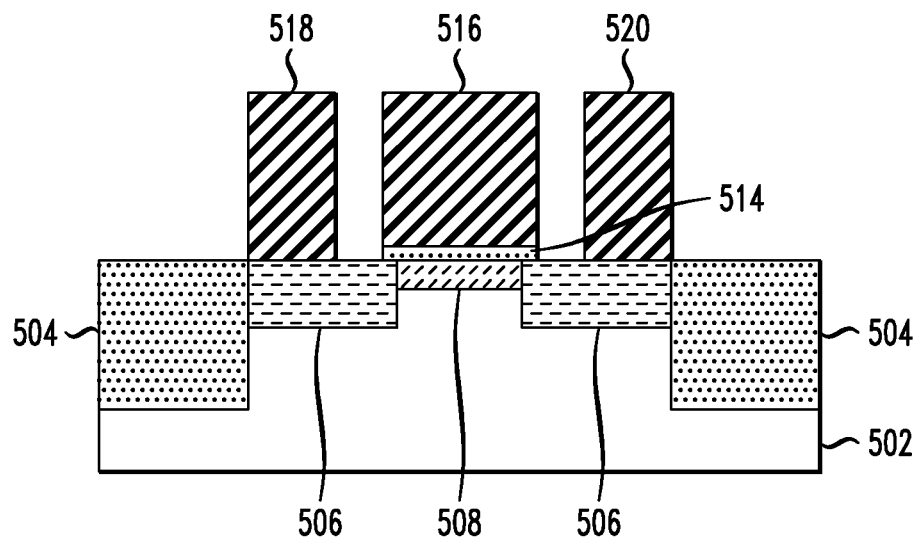
FIG. 5B depicts a first cross-sectional view of a first one of the two planar complementary metal-oxide-semiconductor transistors of FIG. 5A, according to an embodiment of the present invention.
Figure 5C:
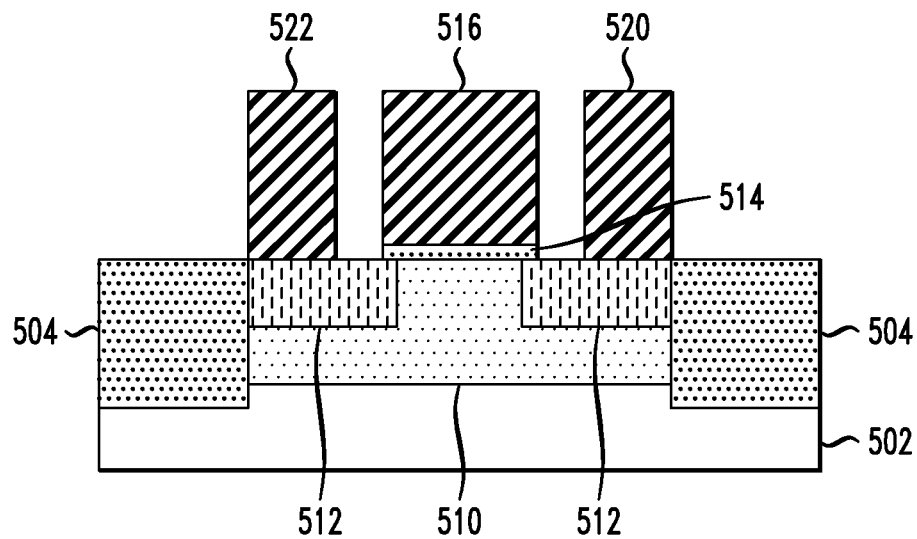
FIG. 5C depicts a second cross-sectional view of a second one of the two planar complementary metal-oxide-semiconductor transistors of FIG. 5A, according to an embodiment of the present invention.

FIG. 5A shows a top-down view 500 of an RPU comprising an analog memory element formed as a floating-gate CMOS device using planar FETs for the enhancement mode PFET and depletion mode NFET. FIG. 5B shows a first cross-sectional view 550 taken along the line B-B in the top-down view 500 of FIG. 5A (e.g., a cross-sectional view of the depletion mode NFET). FIG. 5C shows a second cross-sectional view 575 taken along the line C-C in the top-down view 500 of FIG. 5A (e.g., a cross-sectional view of the enhancement mode PFET).

The floating-gate CMOS device shown in FIGS. 5A-5C includes a substrate 502, assumed in this case to comprise a p-type substrate. Shallow trench isolation (STI) regions 504 are formed as illustrated. The depletion mode NFET includes n+-doped source/drain regions 506. The depletion mode NFET is normally "on" and thus includes an n-doped region 508 below the gate node 516. The enhancement mode PFET is normally "off" and thus does not include a p-doped region below the gate node 516. As illustrated in the top-down view 500, the gate nodes 516 of the depletion mode NFET and enhancement mode PFET are electrically connected, forming a floating gate as described above. The enhancement mode PFET includes an n-well region 510, and p+-doped source/drain regions 512. Although FIGS. 5A-5C illustrate a CMOS structure that assumes a p-type substrate 502 where an n-well 510 is formed below the source/drain regions 512 of the enhancement mode PFET, it should be appreciated that this is only an example. The substrate 502 may be n-type and a p-well may be formed below the source/drain regions 506 of the depletion mode NFET. Moreover, embodiments are not limited to use with planar CMOS structures as noted above.

A gate dielectric 514 is formed as illustrated below the gate node 516. The gate dielectric 514 may be a high-k dielectric, silicon dioxide (SiO$_2$), or another suitable material. The depletion mode NFET includes a first source/drain node 518, which is connected to the "B" terminal shown in FIG. 4. The gate node 516 connects the depletion mode NFET and the enhancement mode PFET to provide a floating gate. The depletion mode NFET and enhancement mode PFET further include a shorted source/drain node 520 as illustrated. The enhancement mode PFET includes a second source/drain node 522, which is connected to the "A" terminal shown in FIG. 4.

Figure 6:
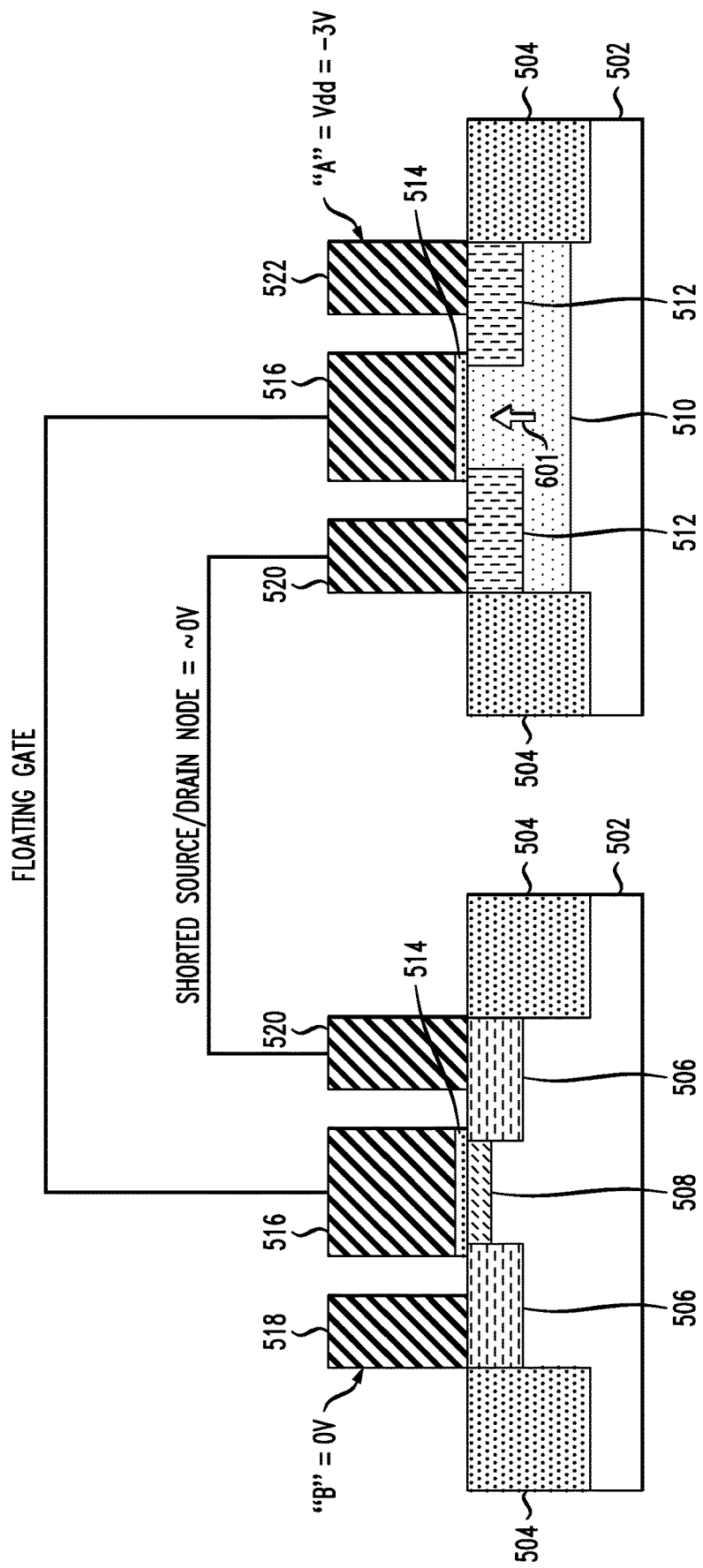
FIG. 6 depicts reducing the resistance of the resistive processing unit shown in FIGS. 5A-5C, according to an embodiment of the present invention.

FIG. 6 illustrates increasing the conductance (reducing the resistance) of the RPU shown in FIGS. 5A-5C. To do so, a ground voltage (e.g., 0V) is applied to terminal B (e.g., source/drain 518 of the depletion mode NFET) and a negative voltage pulse (e.g., Vdd=−3V) is applied to terminal A (e.g., source/drain 522 of the enhancement mode PFET). The shorted node (e.g., source/drain 520 of the enhancement mode PFET and depletion mode NFET) is approximately ground (e.g., ~0V), and electrons are injected 601 into the floating gate 518. The negative voltage pulse duration is adjusted with feedback until a desired conductance or resistance is achieved (e.g., until the floating gate stores a desired electrical charge and the measured current for the RPU matches a desired value).

Figure 7:
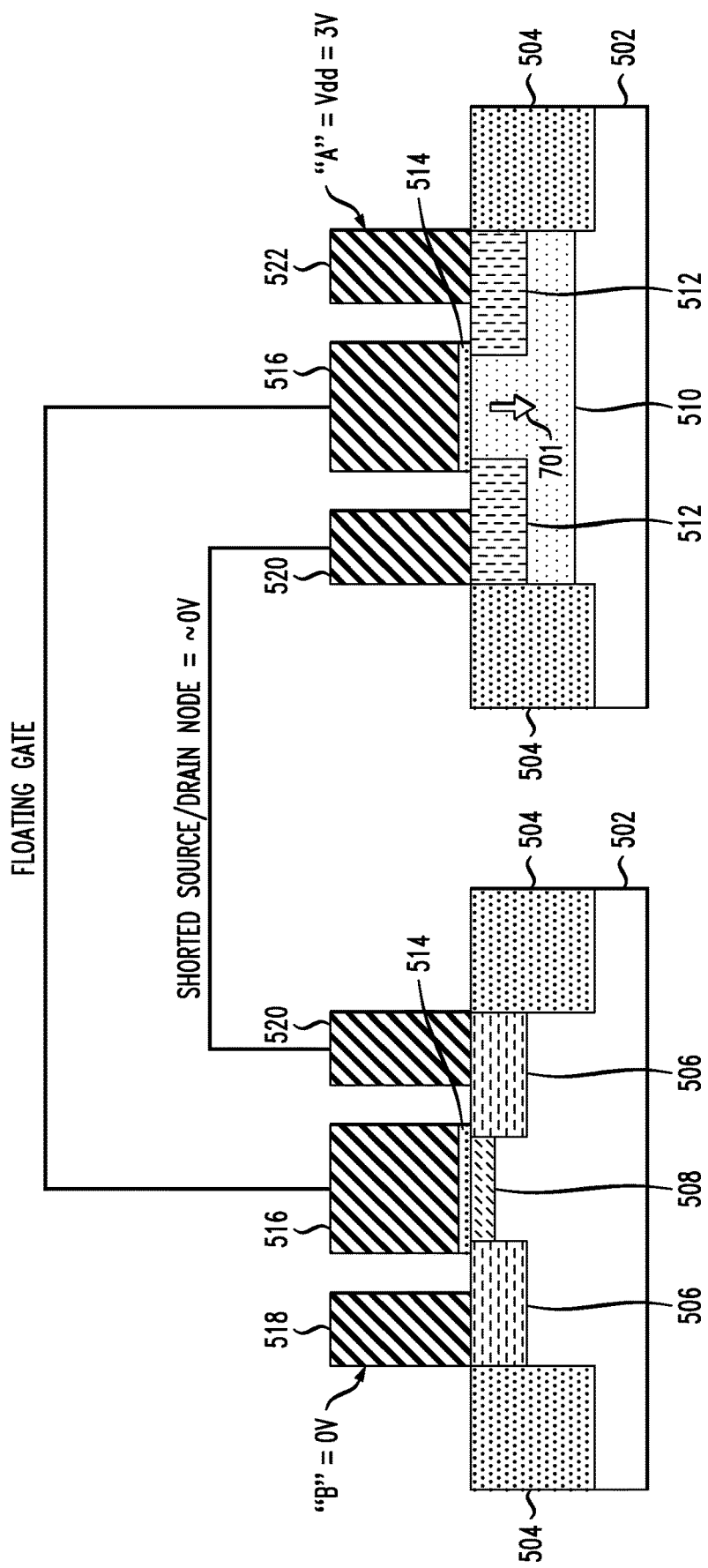
FIG. 7 depicts increasing the resistance of the resistive processing unit shown in FIG. 5A-5C, according to an embodiment of the present invention.

FIG. 7 illustrates decreasing the conductance (increasing the resistance) of the RPU shown in FIGS. 5A-5C. To do so, a ground voltage (e.g., 0V) is applied to terminal B (e.g., source/drain 518 of the depletion mode NFET) and a positive voltage pulse (e.g., Vdd=3V) is applied to terminal A (e.g., source/drain 522 of the enhancement mode PFET). The shorted node (e.g., source/drain 520 of the enhancement mode PFET and depletion mode NFET) is approximately ground (e.g., ~0V), and electrons are subtracted 701 (e.g., "holes" are injected) into the floating gate 518. The negative voltage pulse duration is adjusted with feedback until a desired conductance or resistance is achieved (e.g., until the floating gate stored a desired electrical charge and the measured current for the RPU matches a desired value).

Figure 8:
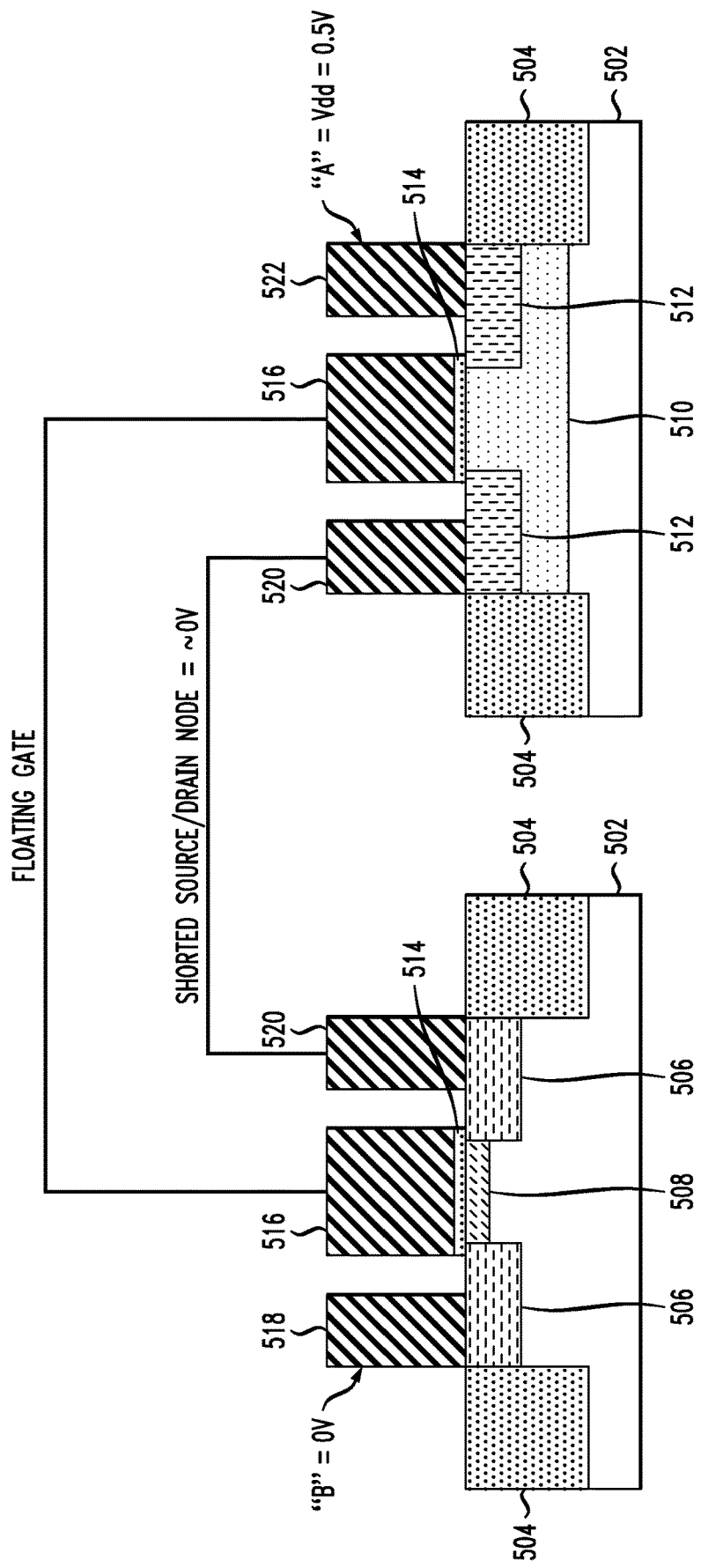
FIG. 8 depicts a forward pass operation in the resistive processing unit shown in FIGS. 5A-5C, according to an embodiment of the present invention.

FIG. 8 illustrates a read or forward pass operation of the RPU shown in FIGS. 5A-5C. To do so, a positive voltage pulse (e.g., Vdd=0.5V) is applied to terminal A (e.g., source/drain 522 of the enhancement mode PFET) corresponding to the input line of the crossbar array including the RPU. The terminal B (e.g., source/drain 518 of the depletion mode NFET) may be at ground voltage (e.g., 0V), and the shorted node (e.g., source/drain 520 of the enhancement mode PFET and depletion mode NFET) may be approximately ground (e.g., ~0V). The "current" across the floating-gate CMOS is read out to read the weight value (e.g., the conductance or resistance provided by the stored electrical charge in the floating gate 516).

It should be appreciated that the particular voltage values used for the positive and negative voltage pulses and ground voltages described above are presented by way of example only, and that embodiments are not limited to use with these specific voltages.

In some embodiments, a cross-bar array comprises one or more input row lines, one or more output column lines, one or more RPUs coupled at one or more intersections of the one or more input row lines and the one or more output column lines, and a control circuit. A given one of the one or more RPUs comprises an analog memory element comprising a first terminal coupled to a given one of the input row lines and a second terminal coupled to a given one of the output column lines. The analog memory element comprising a CMOS structure comprising an NFET and a PFET. A gate of the NFET is coupled to a gate of the PFET to provide a floating gate. The control circuit is configured to read a synaptic weight value of the given RPU by measuring a stored electrical charge of the floating gate.

In some embodiments, a first source/drain terminal of the NFET is shorted to a first source/drain terminal of the PFET, a second source/drain terminal of the NFET is coupled to given output column line, and a second source/drain terminal of the PFET is coupled to the given input row line.

The NFET may comprise a depletion mode transistor and the PFET may comprise an enhancement mode transistor.

The control circuit may comprise one or more current integrators coupled to the one or more output column lines, the control circuit being configured in a forward pass operation to read the synaptic weight value by measuring a current across the given RPU using a given one of the current integrators coupled to the given output column line. The control circuit may further comprise a current mirror configured to provide a reference current to the given current integrator, wherein reading the synaptic weight value in the forward pass operation comprises determining a sign of the synaptic weight value by comparing the measured current across the given RPU to the reference current. The control circuit may further comprise one or more ADCs coupled to the one or more current integrators, wherein reading the synaptic weight value further comprises converting the measured current across the given RPU to a numerical weight value utilizing a given one of the one or more ADCs coupled to the given output column line.

In some embodiments, an RPU comprises an analog memory element comprising a first terminal coupled to an input row line of a cross-bar array and a second terminal coupled to an output column line of the cross-bar array. The analog memory element comprises a CMOS structure comprising an NFET and a PFET. A gate of the NFET is coupled to a gate of the p-type field effect transistor to provide a floating gate. A stored electrical charge of the floating gate provides a synaptic weight value of the RPU.

In some embodiments, a first source/drain terminal of the NFET is shorted to a first source/drain terminal of the PFET, a second source/drain terminal of the NFET is coupled to the output column line, and a second source/drain terminal of the PFET is coupled to the input row line.

In some embodiments, the NFET comprises a depletion mode transistor and the PFET comprises an enhancement mode transistor.

In some embodiments, a method for reading a synaptic weight value of a given RPU comprises applying a first voltage to a given one of one or more input row lines of a cross-bar array, applying a second voltage to a given one of one or more output column lines of the cross-bar array, and measuring a current across the given RPU having a first terminal coupled to the given input row line and a second terminal coupled to the given output row line. The given RPU comprises an analog memory element comprising a CMOS structure comprising an NFET and a PFET, a gate of the NFET being coupled to a gate of the p-type field effect transistor to provide a floating gate, and the measured current being a function of a stored electrical charge of the floating gate providing the synaptic weight value of the given RPU.

In some embodiments, a first source/drain terminal of the NFET is shorted to a first source/drain terminal of the PFET, a second source/drain terminal of the NFET is coupled to given output column line, and a second source/drain terminal of the PFET is coupled to the given input row line.

In some embodiments, the NFET comprises a depletion mode transistor and the PFET comprises an enhancement mode transistor.

Measuring the current across the given RPU may comprise utilizing a given one of one or more current integrators of a control circuit, the given current integrator being coupled to the given output column line. The method may further comprise determining a sign of the synaptic weight value by comparing the measured current across the given RPU with a reference current provided by a current mirror of the control circuit. The method may further comprise converting the measured current to a numerical weight value utilizing a given one of one or more ADCs of the control circuit coupled to the given current integrator.

Measuring the current across the given RPU may comprise applying the first voltage to the given input row line and applying a zero voltage to other ones of the input row lines, the first voltage being a fixed, non-zero voltage.

The method may further comprise updating the synaptic weight value of the given RPU to increase the synaptic weight value by injecting electrons into the floating gate to increase the stored electrical charge of the floating gate. Injecting electrons into the floating gate may comprise applying a negative voltage pulse to the given input row line coupled to the first terminal of the given RPU, applying a ground voltage to the given output column line coupled to the second terminal of the given RPU, and applying a fixed negative voltage to other ones of the input row lines and the output column lines, the fixed negative voltage having a lower amplitude than the negative voltage pulse applied to the given input row line.

The method may further comprise updating the synaptic weight value of the given RPU to decrease the synaptic weight value by subtracting electrons from the floating gate to decrease the stored electrical charge of the floating gate. Subtracting electrons from the floating gate may comprise applying a positive voltage pulse to the given input row line coupled to the first terminal of the given RPU, applying a ground voltage to the given output column line coupled to the second terminal of the given RPU, and applying a fixed positive voltage to other ones of the input row lines and the output column lines, the fixed positive voltage having a lower amplitude than the positive voltage pulse applied to the given input row line.

In the description above, various materials, dimensions and ranges of values for different elements are provided. Unless otherwise noted, such materials are given by way of example only and embodiments are not limited solely to the specific examples given. Similarly, unless otherwise noted, all dimensions and ranges are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A cross-bar array, comprising:
   one or more input row lines;
   one or more output column lines;
   one or more resistive processing units coupled at one or more intersections of the one or more input row lines and the one or more output column lines; and
   a control circuit;
   wherein a given one of the one or more resistive processing units comprising an analog memory element comprising a first terminal coupled to a given one of the input row lines and a second terminal coupled to a given one of the output column lines;
   wherein the analog memory element comprising a complementary metal-oxide-semiconductor structure comprising an n-type field-effect transistor and a p-type field-effect transistor;
   wherein a gate of the n-type field-effect transistor is coupled to a gate of the p-type field effect transistor to provide a floating gate; and
   wherein the control circuit is configured to read a synaptic weight value of the given resistive processing unit by measuring a stored electrical charge of the floating gate.

2. The cross-bar array of claim 1, wherein a first source/drain terminal of the n-type field-effect transistor is shorted to a first source/drain terminal of the p-type field-effect transistor, a second source/drain terminal of the n-type field-effect transistor is coupled to given output column line, and a second source/drain terminal of the p-type field-effect transistor is coupled to the given input row line.

3. The cross-bar array of claim 1, wherein the n-type field-effect transistor comprises a depletion mode transistor and the p-type field-effect transistor comprises an enhancement mode transistor.

4. The cross-bar array of claim 1, wherein the control circuit comprises one or more current integrators coupled to the one or more output column lines, the control circuit being configured in a forward pass operation to read the synaptic weight value by measuring a current across the given resistive processing unit using a given one of the current integrators coupled to the given output column line.

5. The cross-bar array of claim 4, wherein the control circuit further comprises a current mirror configured to provide a reference current to the given current integrator, wherein reading the synaptic weight value in the forward pass operation comprises determining a sign of the synaptic weight value by comparing the measured current across the given resistive processing unit to the reference current.

6. The cross-bar array of claim 4, wherein the control circuit further comprises one or more analog-to-digital converters coupled to the one or more integrators, wherein reading the synaptic weight value further comprises converting the measured current across the given resistive processing unit to a numerical weight value utilizing a given one of the one or more analog-to-digital converters coupled to the given output column line.

7. A resistive processing unit, comprising:
- an analog memory element comprising a first terminal coupled to an input row line of a cross-bar array and a second terminal coupled to an output column line of the cross-bar array;
- the analog memory element comprising a complementary metal-oxide-semiconductor structure comprising an n-type field-effect transistor and a p-type field-effect transistor;
- a gate of the n-type field-effect transistor being coupled to a gate of the p-type field effect transistor to provide a floating gate; and
- a stored electrical charge of the floating gate providing a synaptic weight value of the resistive processing unit.

8. The resistive processing unit of claim 7, wherein a first source/drain terminal of the n-type field-effect transistor is shorted to a first source/drain terminal of the p-type field-effect transistor, a second source/drain terminal of the n-type field-effect transistor is coupled to the output column line, and a second source/drain terminal of the p-type field-effect transistor is coupled to the input row line.

9. The resistive processing unit of claim 7, wherein the n-type field-effect transistor comprises a depletion mode transistor and the p-type field-effect transistor comprises an enhancement mode transistor.

10. A method for reading a synaptic weight value of a given resistive processing unit, comprising:
- applying a first voltage to a given one of one or more input row lines of a cross-bar array;
- applying a second voltage to a given one of one or more output column lines of the cross-bar array; and
- measuring a current across the given resistive processing unit having a first terminal coupled to the given input row line and a second terminal coupled to the given output row line;
- wherein the given resistive processing unit comprises an analog memory element comprising a complementary metal-oxide-semiconductor structure comprising an n-type field-effect transistor and a p-type field-effect transistor, a gate of the n-type field-effect transistor being coupled to a gate of the p-type field effect transistor to provide a floating gate, and the measured current being a function of a stored electrical charge of the floating gate providing the synaptic weight value of the given resistive processing unit.

11. The method of claim 10, wherein a first source/drain terminal of the n-type field-effect transistor is shorted to a first source/drain terminal of the p-type field-effect transistor, a second source/drain terminal of the n-type field-effect transistor is coupled to given output column line, and a second source/drain terminal of the p-type field-effect transistor is coupled to the given input row line.

12. The method of claim 10, wherein the n-type field-effect transistor comprises a depletion mode transistor and the p-type field-effect transistor comprises an enhancement mode transistor.

13. The method of claim 10, wherein measuring the current across the given resistive processing unit comprises utilizing a given one of one or more current integrators of a control circuit, the given current integrator being coupled to the given output column line.

14. The method of claim 13, further comprising determining a sign of the synaptic weight value by comparing the measured current across the given resistive processing unit with a reference current provided by a current mirror of the control circuit.

15. The method of claim 13, further comprising converting the measured current to a numerical weight value utilizing a given one of one or more analog-to-digital converters of the control circuit coupled to the given current integrator.

16. The method of claim 10, wherein measuring the current across the given resistive processing unit comprises applying the first voltage to the given input row line and applying a zero voltage to other ones of the input row lines, the first voltage being a fixed, non-zero voltage.

17. The method of claim 10, further comprising updating the synaptic weight value of the given resistive processing unit to increase the synaptic weight value by injecting electrons into the floating gate to increase the stored electrical charge of the floating gate.

18. The method of claim 17, wherein injecting electrons into the floating gate comprises:
- applying a negative voltage pulse to the given input row line coupled to the first terminal of the given resistive processing unit;
- applying a ground voltage to the given output column line coupled to the second terminal of the given resistive processing unit; and
- applying a fixed negative voltage to other ones of the input row lines and the output column lines, the fixed negative voltage having a lower amplitude than the negative voltage pulse applied to the given input row line.

19. The method of claim 10, further comprising updating the synaptic weight value of the given resistive processing unit to decrease the synaptic weight value by subtracting electrons from the floating gate to decrease the stored electrical charge of the floating gate.

20. The method of claim 19, wherein subtracting electrons from the floating gate comprises:
- applying a positive voltage pulse to the given input row line coupled to the first terminal of the given resistive processing unit;

applying a ground voltage to the given output column line coupled to the second terminal of the given resistive processing unit; and applying a fixed positive voltage to other ones of the input row lines and the output column lines, the fixed positive voltage having a lower amplitude than the positive voltage pulse applied to the given input row line.

\* \* \* \* \*